United States Patent
Cao et al.

(10) Patent No.: US 9,660,633 B2
(45) Date of Patent: May 23, 2017

(54) POWER GATING

(71) Applicant: International Business Machines Corporation, Armonk, NY (US)

(72) Inventors: Hai Cao, Hangzhou (CN); Si Shi, Shanghai (CN); Rui Tu, Shanghai (CN); Bo Qu, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 14/793,874

(22) Filed: Jul. 8, 2015

(65) Prior Publication Data

US 2016/0036429 A1    Feb. 4, 2016

(30) Foreign Application Priority Data

Jul. 31, 2014   (CN) .......................... 2014 1 0373470

(51) Int. Cl.
*H03K 17/00* (2006.01)
*H03K 17/04* (2006.01)
*H03K 17/56* (2006.01)
*H03K 19/00* (2006.01)

(52) U.S. Cl.
CPC ............. *H03K 17/04* (2013.01); *H03K 17/56* (2013.01); *H03K 19/0016* (2013.01)

(58) Field of Classification Search
CPC ...... H03K 17/00; H03K 17/04; H03K 17/042; H03K 17/04206; H03K 17/04213; H03K 17/12; H03K 17/122; H03K 17/125; H02M 3/1563; H02M 3/155
USPC ................................... 327/365; 323/282–286
See application file for complete search history.

(56) References Cited

U.S. PATENT DOCUMENTS

| | | | |
|---|---|---|---|
| 4,758,743 | A | 7/1988 | Dehganpour |
| 5,708,368 | A | 1/1998 | Mallory |
| 6,127,746 | A | 10/2000 | Clemente |
| 6,636,976 | B1 | 10/2003 | Grochowski |
| 7,193,450 | B1 | 3/2007 | Broughton |

(Continued)

OTHER PUBLICATIONS

Park, Shihong, et al., "Flexible dv/dt and di/dt control method for insulated gate power switches," IEEE Transactions on Industry Applications, vol. 39, No. 3, May/Jun. 2003.

(Continued)

*Primary Examiner* — Lincoln Donovan
*Assistant Examiner* — Diana J Cheng
(74) *Attorney, Agent, or Firm* — Matthew C. Zehrer

(57) ABSTRACT

A circuit and method for power gating is provided. The circuit includes a switch circuit and a modulation oscillator. The switch circuit is connected between a circuit module and a power network having a target level. The switch circuit receives a control signal at its control signal input terminal to gate a connection between the circuit module and the power network under the control of the control signal. The switch circuit is connected to the circuit module at a first node. A modulation oscillator enabling signal input terminal is connected to a gating signal for enabling the modulation oscillator, a modulation oscillator control signal input terminal is connected to the first node, and an modulation oscillator output terminal is connected to the control signal input terminal of the switch circuit. The oscillation signal outputted from the modulation oscillator is modulated by the level of the first node.

11 Claims, 6 Drawing Sheets

(56) References Cited

U.S. PATENT DOCUMENTS

| | | |
|---|---|---|
| 7,533,286 B2 | 5/2009 | Mosur |
| 7,643,591 B2 | 1/2010 | Arsovski |
| 7,667,524 B2 | 2/2010 | Thierry |
| 7,685,458 B2 | 3/2010 | Yamaoka |
| 7,999,600 B2 | 8/2011 | Havanur |
| 8,264,212 B2 * | 9/2012 | Takahashi ............. H02M 3/157 323/283 |
| 8,504,967 B2 | 8/2013 | Suzuki |

OTHER PUBLICATIONS

Idir, Nadir, et al., "Active gate voltage control of turn-on di/dt and turn-off dv/dt in insulated gate transistors," IEEE Transactions on Power Electronics, vol. 21, No. 4, Jul. 2006.

Fink, K., et al., "Advanced Gate Drive Unit With Closed-Loop dic/dt Control," IEEE Transactions on Power Electronics, vol. 28, Issue: 5, May 2013.

Rose, M., et al., "Adaptive dv/dt and di/dt control for isolated gate power devices," Energy Conversion Congress and Exposition (ECCE), IEEE, 2010.

* cited by examiner

POWER GATING

FIELD OF THE EMBODIMENTS

Embodiments of the present invention relate to the circuitry technology, and more specifically, to a power gating circuit and method for power gating.

DESCRIPTION OF THE RELATED ART

After a circuit module is powered, due to the existence of leak current, there is a certain amount of power consumption even if the circuit module does not operate at all. To address this problem, a power gating technology has been proposed, i.e., the connection between a circuit module and a power network is gated by a switch circuit. Those skilled in the art may appreciate that a circuit module must be connected to both a power supply and the group in order to operate properly. Thus, to gate the connection between the circuit module and the power network, either a connection between the circuit module and a power supply or a connection between the circuit module and the ground may be gated.

FIG. 1 shows a schematic diagram of gating the connection between a circuit module and a power supply with a switch circuit. The switch circuit is connected between the circuit module and the power supply, and the circuit module is further connected to the ground. Herein, the power supply and the ground comprise a point in the power network at a level consistent with a power level, and a point in the power network at a level consistent with a ground level, respectively. A gating signal PGSEL is connected to a control signal input terminal of the switch circuit as a switch circuit control signal. When the gating signal PGSEL is at one of a logic high level and a logic low level, the switch circuit is in a turn-on state, so that the circuit module is connected to both the power supply and the ground. Correspondingly, the circuit module is in an activated state. When the gating signal PGSEL is at the other level of the logic high level and the logic low level, the switch circuit is in a turn-off state, so that the circuit module is only connected to the ground, but is not connected to the power supply. Correspondingly, the circuit module is in a dormant state. Because the circuit module is disconnected from the power supply, leak current flowing through the circuit module in the idle state becomes is reduced, so that power consumption of the circuit module in the idle state may be reduced. The turn-on/off of the switch circuit is controlled through setting the gating signal PGSEL to different levels, so as to control whether the circuit module is in the activated state or the dormant state.

Sudden changes in load may cause variations in power supply characteristics. Particularly, when a circuit module is connected to a power supply, the circuit module is required to be charged, causing a large amount of charges to be transferred from the power supply to the circuit module. The transfer of a large amount of charges in a short duration may cause jitters in power supply level, causing noises in other circuit modules adjacent to the wakened circuit module. Usually, this negative effect may be relieved by using two methods.

One method is to adopt multiple switch circuits for power gating. These switch circuits are enabled one by one at a particular interval when a circuit module is connected to a power supply. Thus, enabling various switch circuits may cause relatively small changes in the power supply load, which are staggered in time. This method requires providing multiple switch circuit control signals for one circuit module.

The other method is to reduce the level switching rate of the gating signal PGSEL. The level switching rate of a signal represents the rate of the signal switching from a level to another level. Changing the gating signal PGSEL from a jumping signal to a slowly varied signal may turn off or turn on the switch circuit slowly. However, in general, it is desired to make the level switching rate as fast as possible. Thus, this method requires generating a special signal as PGSEL.

SUMMARY

A circuit and method for power gating is provided in an embodiment of this invention to reduce the influence of power gating on the power network.

A circuit for power gating according to an embodiment of this invention includes a switch circuit connected between a circuit module and a power network having a target level, the switch circuit receiving a control signal at its control signal input terminal to gate a connection between the circuit module and the power network under the control of the control signal, wherein the switch circuit is connected to the circuit module at a first node; and a modulation oscillator of which an enabling signal input terminal is connected to a gating signal for enabling the modulation oscillator, a control signal input terminal is connected to the first node, and an output terminal is connected to the control signal input terminal of the switch circuit, wherein an oscillation signal outputted from the modulation oscillator is modulated by the level of the first node.

A method for power gating according to an embodiment of this invention includes receiving a gating signal which is used to indicate it is required to convert a level of a first node to a target level by a switch circuit, wherein the switch circuit is connected between the first node and a second node having the target level; in response to the gating signal, generating an oscillation signal; and controlling the switch circuit with the oscillation signal so that the switch circuit alternatively turns on and off a connection between the first node and the second node, wherein the oscillation signal is modulated by the level of the first node.

With the solution provided in the embodiments of this invention, the influence of power gating on the power network can be reduced.

BRIEF DESCRIPTION OF THE FIGURES

Through the more detailed description of embodiments of the present disclosure in the accompanying drawings, the above and other objects, features and advantages of the present disclosure will become more apparent, wherein the same reference numeral generally refers to the same components in the embodiments of the present disclosure.

FIG. 8A and FIG. 8B shows performance graphs associated with embodiments of this invention.

DETAILED DESCRIPTION

Figure 1:
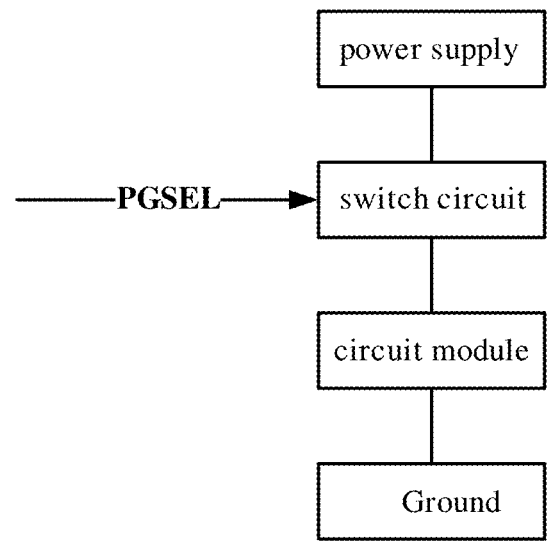
FIG. 1 is a circuit for power gating in the prior art.

With reference to the drawings, a description of this invention will be given below in connection with particular embodiments, which is merely for the purpose of illustration, but not a limitation to the scope of this invention. The drawings are given merely for illustration, and therefore may not be drawn to scale. Further, when a first element is described as being connected with or to a second element, the first element may be connected with the second element directly, or may be connected with the second element indirectly through a third element. Further, some elements that are unnecessary for the understanding of this invention are omitted for clarity. In the drawings, similar and corresponding elements are represented by similar reference numerals.

Those skilled in the art may appreciate that, in digital circuits, there are symmetrical relationships for levels and the device types. For example, N-type transistors turn on at high levels and P-type transistors turn on at low levels. Therefore, conditions of high and low levels involved in the description below may be changed through changing the types of related devices. Further, the shown conditions may be changed through providing additional devices. For example, for a N-type transistor turning on at a high level, if an inverter is added between the gate of the N-type transistor and its input signal, the transistor may turn on when the input signal is at a low level. Also, when only the turn-on/turn-off characteristic of a transistor is considered, the gate and the drain of the transistor may be exchanged. These changes are all equivalent to the embodiments of this invention described below and fallen within the scope of this invention.

Figure 2:
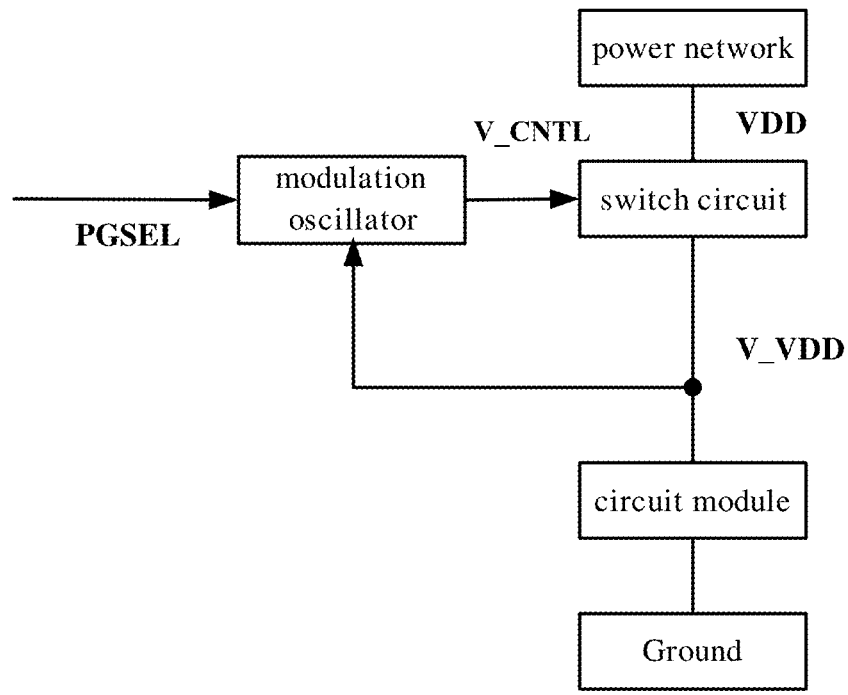
FIG. 2, FIG. 4 and FIG. 6 are circuits for power gating according to embodiments of this invention.

FIG. 2 shows a circuit for power gating according to an embodiment of this invention. In FIG. 2, a switch circuit is provided between a circuit module and a power supply. The term circuit module is defined herein to be a self-contained circuit, such as an assembly of electronic components and associated wiring, which itself is capable of performing a defined task and can be linked with other such circuit modules or devices to form a larger electronic system.

When the switch circuit is turned on, the circuit module is connected to both the power supply and the ground, and thus is in an activated state. When the switch circuit is turned off, the circuit module is connected to the ground and is not connected to the power supply, entering into a dormant state. According to another embodiment of this invention, a switch circuit may be provided between the circuit module and the ground. When the switch circuit is turned on, the circuit module is connected to both the power supply and the ground, and thereby is in the activated state; when the switch circuit is turned off, the circuit module is connected to the power supply and is not connected to the ground, entering into a dormant state. According to still another embodiment of this invention, a first switch circuit is provided between the circuit module and the power supply and a second switch circuit is provided between the circuit module and the ground. When both the first and second switch circuits are turned on, the circuit module is connected to both the power supply and the ground, and thus is in an activated state. In the description below, an example is given in which the switch circuit is located between the power supply and the circuit module. However, the described structure is also applicable for a situation in which the switch circuit is provided between the circuit module and the ground.

In FIG. 2, the switch circuit is connected with the circuit module at a first node. Those skilled in the art may appreciate that after the circuit module is disconnected from the power supply by the switch circuit, it is only connected to the ground, and thereby the level of the first node is consistent with the ground level. After the circuit module is connected to the power supply by the switch circuit, the level of the first node converts from the ground level to a power supply level. In other words, the gating signal may be also considered as an indication signal for indicating whether it is required to convert the level of the first node from the present level to a target level that is different from the present level. Hereinafter, the level of the first node is represented by V_VDD.

The gating signal PGSEL is connected to the enabling signal input terminal of a modulation oscillator. The output terminal of the modulation oscillator is connected to the control signal input terminal of the switch circuit. The modulation oscillator outputs an oscillation signal after it is enabled. The outputted oscillation signal may be a sinusoidal wave or a square wave, or may be any other oscillation waveforms. Those skilled in the art may easily convert an oscillation waveform into another oscillation waveform. Hereinafter, the level of the oscillation signal outputted from the modulation oscillator is represented by V_CNTL.

The control signal input terminal of the modulation oscillator is connected to the first node. Thereby, the oscillation signal outputted from the modulation oscillator is modulated by V_VDD.

For a particular circuit module, the amount of charges required to charge the circuit module is fixed. In FIG. 2, the oscillation signal is used as a switch circuit control signal. Thereby, under the control of the oscillation signal, the switch circuit may be in a turn-on state sometimes and in a turn-off state sometimes. According to an embodiment of this invention, the charging process of the circuit module will comprise multiple oscillation cycles of the oscillation signal, and thereby the switch circuit will change from turn-off to turn-on and then from turn-on to turn-off several times. Thus, the amount of charges required for charging transfers into the circuit module in multiple phases, in each of which a relatively small amount of charges is transferred, with a little influence on the power supply. In addition, because various charging phases are staggered in time from each other, even influences on the power supply of the various charging phases may be superimposed on each other, the superimposed influence is relatively small.

According to an embodiment of this invention, the relationship between the oscillation signal outputted from the modulation oscillator and V_VDD may be described as: the larger difference between V_VDD and the level of the power supply, the smaller amount of charges transferred during one turn-on duration of the switch circuit under the control of the oscillation signal. This has an advantage that the amount of charges transferred during each turn-on duration of the switch circuit is increased over time, realizing a balance between noise reduction and speed increase of the switch circuit. Certainly, if the oscillation signal and V_VDD are set to make the difference between V_VDD and the level of the power supply larger, the amount of charges transferred during one turn-on duration of the switch circuit under the control of the oscillation signal is larger, and such relationship may also achieve the object of this invention.

Below, how to modulate the oscillation signal outputted from the modulation oscillator using V_VDD will be described with reference to FIGS. 3A to 3C. As to the switch circuit, it is assumed the switch circuit is turned on when the switch circuit control signal is at a low level; the switch circuit is turned off when the switch circuit control signal is at a high level. As to the modulation oscillator, it is assumed the modulation oscillator operates when the enabling signal of the modulation oscillator is at the low level, and it is assumed the peak of the oscillation signal outputted from the modulation oscillator is fixed to the power supply level.

Figure 3A:
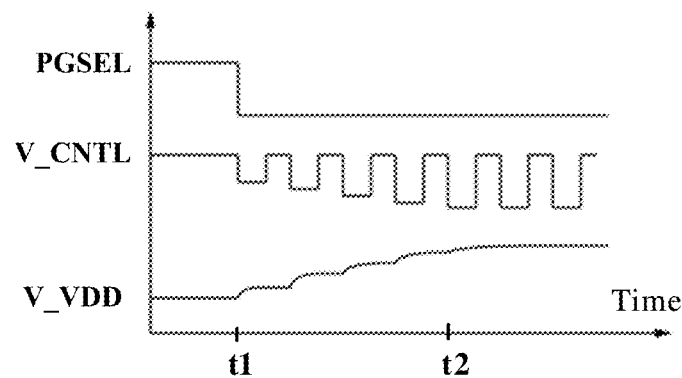
FIG. 3A to FIG. 3C and FIG. 5A to FIG. 5C are waveforms of associated circuits for power gating according to embodiments of this invention.

FIG. 3A shows a situation of modulating the amplitude of V_CNTL using V_VDD. Specifically, the amplitude is a decreasing function of the difference between V_VDD and the power supply level. As shown in FIG. 3, at the start of a charging process, the level of V_VDD is the ground level; after the completion of the charging process, the level of V_VDD becomes the power supply level. In other words, V_VDD gradually approaches to the power supply level over time. Correspondingly, the amplitude of the oscillation signal becomes larger over time. Because the peak of the oscillation signal is fixed to the power supply level, the valley level of the oscillation signal becomes lower gradually.

Those skilled in the art may appreciate that an actual switch circuit generally corresponds to a threshold level between a logic-high level and a logic-low level. With a switch circuit turning on when the switch circuit control signal is at a low level as an example, when the level of the switch circuit control signal is higher than the threshold level, the switch circuit is turned off; when the level of the switch circuit control signal is lower than the threshold level, the switch circuit is turned on, with a larger impedance however; the closer the level of the switch circuit control signal is to the ground level, the smaller impedance the switch circuit has, and the larger the current that flows through the switch circuit is. When the switch circuit control signal reaches the ground level, the switch circuit has minimum impedance and the current flowing through the switch circuit gets its maximum value.

As shown in FIG. 3A, at time t1, in order to turn on the switch circuit, the gating signal PGSEL changes to a low level, so that the modulation oscillator starts to operate. The peak level of the oscillation signal is fixed to the power supply level and thus may not turn on the switch circuit. Assume that the initial valley level of the oscillation signal is lower than the threshold level, the switch circuit turns on during the first valley duration of the oscillation signal, and thus the circuit module is charged for the first time. The valley level of the oscillation signal becomes lower gradually, and the switch circuit turns on during each of subsequent valley durations, so that the circuit module is charged several times. Further, the later a valley duration is, the lower the level of the switch circuit control signal is, and thus the smaller impedance the switch circuit has, and the larger the current that flows through the switch circuit is. Because the valleys have a constant time length, the amount of charges transferred within one valley duration becomes larger and larger. That is, the closer V_VDD approaches to the power supply level, the larger amount of charges is transferred during one turn-on duration (i.e., one valley duration) of the switch circuit under the control of the oscillation signal. At time t2, V_VDD reaches the power supply level, and the valley level of the oscillation signal remains unchanged.

Figure 3B:
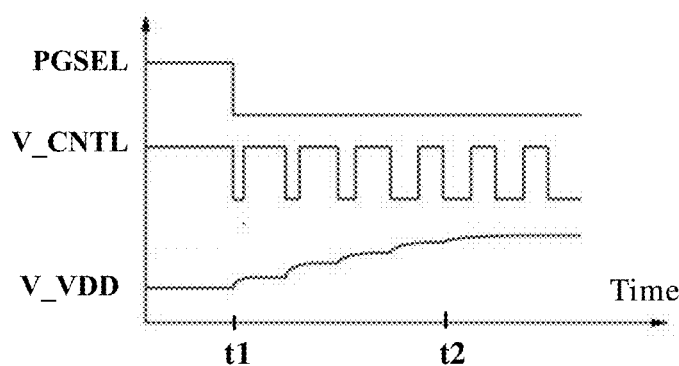

FIG. 3B shows a situation of modulating the duty ratio of V_CNTL using V_VDD. In the context of this application, a duty ratio means the ratio of the duration during which the switch circuit can be turned on in one cycle of the oscillation signal. With this definition, the duty ratio is a decreasing function of the difference between V_VDD and the power supply level. In FIG. 3B, the peak level of the oscillation signal is fixed to the power supply level, and the valley level is fixed to the ground level. Thus, the switch circuit can be turned on at each valley, and the same amount of current flows through the switch circuit each time the switch circuit is turned on. With the elapse of the time, the percentage of valleys in the oscillation signal becomes larger and larger. It may be understood that under the condition that the current is the same, the longer the current lasts, the more charges transfer. That is, the closer V_VDD approaches to the power supply level, the larger amount of charges is transferred during one turn-on duration (i.e., one valley duration) of the switch circuit under the control of the oscillation signal. At time t2, V_VDD reaches the power supply level, and the duty ratio of the oscillation signal remains unchanged.

Figure 3C:
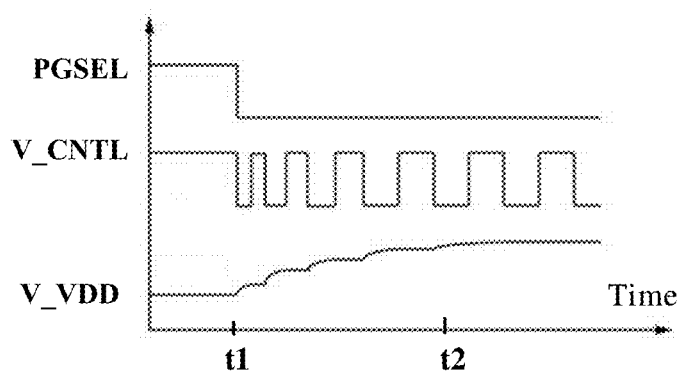

FIG. 3C shows a situation of modulating the cycle of V_CNTL using V_VDD. The cycle is a decreasing function of the difference between V_VDD and the power supply level. It may be understood that, in the case that the amplitude and the duty ratio of the oscillation signal are unchanged, the longer the cycle of the oscillation signal is, the longer the duration of the valley is. Correspondingly, the amount of charges through the switch circuit during each valley duration is larger. That is, the closer V_VDD approaches to the power supply level, the larger amount of charges is transferred during one turn-on duration (i.e., one valley duration) of the switch circuit under the control of the oscillation signal. At time t2, V_VDD reaches the power supply level, and the cycle of the oscillation signal remains unchanged.

FIGS. 3A to 3C respectively show situations of modulating the amplitude, duty ratio and cycle of the oscillation signal by the difference between V_VDD and the power supply level. According to embodiments of this invention, any two or three of amplitude modulation, duty ratio modulation, and cycle modulation may be combined.

As described above, the gating signal PGSEL is at one logic-level when it is required to set the circuit module to the activated state, and is at the other logic-level when it is required to set the circuit module to the dormant state. In the structure shown in FIG. 2, the PGSEL signal is used as an enabling signal of the modulation oscillator, and is used to enable the modulation oscillator when it is required to set the circuit module to the activated state. That is to say, when the circuit module is in the activated state, the modulation oscillator is always enabled and output an oscillation signal all the time. This may cause extra power consumption. As shown in FIGS. 3A to 3C, after time t2, although V_VDD has reached the power supply level, the modulation oscillator still outputs the oscillation signal.

Figure 4:
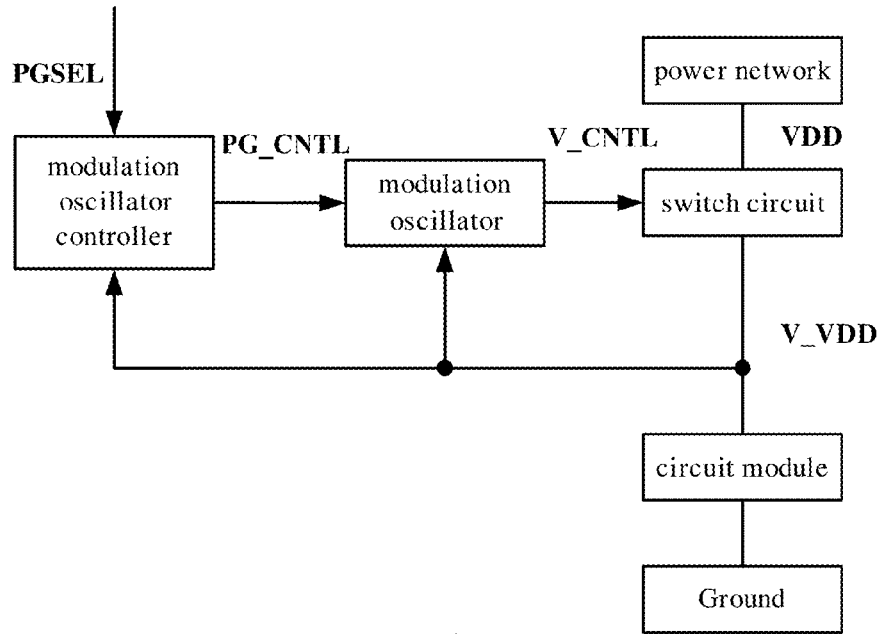

FIG. 4 is a circuit for power gating according to another embodiment of this invention. In FIG. 4, as compared with FIG. 2, a modulation oscillator controller is added, and the gating signal PGSEL is connected to one input terminal of the modulation oscillator controller and another input terminal of the modulation oscillator controller is connected to the first node, i.e., the node where the switch circuit is connected with the circuit module. The output of the modulation oscillator controller is connected to the enabling signal input terminal of the modulation oscillator, and the output level is represented by PG_CNTL. Other connections are the same as those in FIG. 2, which will not be repeated herein.

The modulation oscillator controller is used to enable the modulation oscillator when the gating signal is valid and the level of V_VDD reaches the power supply level. Those skilled in the art may design many schemes to realize the modulation oscillator controller. For example, still assume that the switch circuit is turned on when the switch circuit control signal is at a low level; and the modulation oscillator operates when the enabling signal of the modulation oscillator is at a low level. With such an assumption, inside the modulation oscillator controller, a signal from V_VDD and the gating signal PGSEL can be used as inputs of an OR gate, and the output of the OR gate is used as the enabling signal PG_CNTL of the modulation oscillator. Thus, when the circuit module is in the dormant state, PGSEL is at the logic-high level, V_VDD is at the logic-low level, and the output of the OR gate is at the logic-high level, so that the modulation oscillator does not operate; at the start of a charging process, PGSEL is at the logic-low level, V_VDD is at the logic-low level, and the output of the OR gate is the logic-low level, so that the modulation oscillator operates; when the charging process completes, PGSEL is at the logic-low level, V_VDD is at the logic-high level, and the output of the OR gate is at the logic-high level, so that the modulation oscillator does not operate.

Figure 5A:
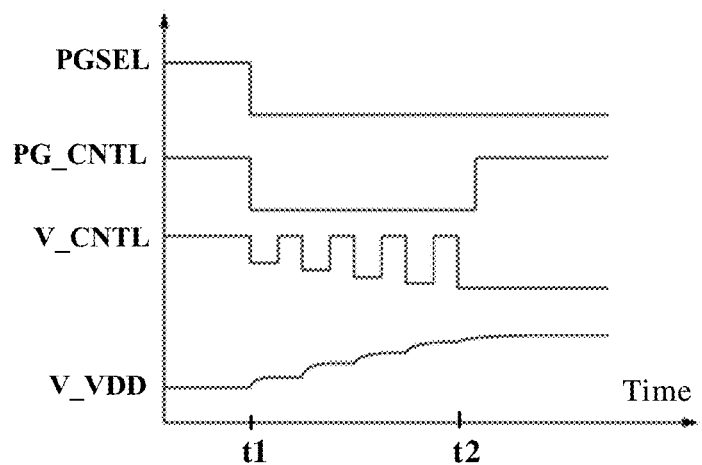
Figure 5B:
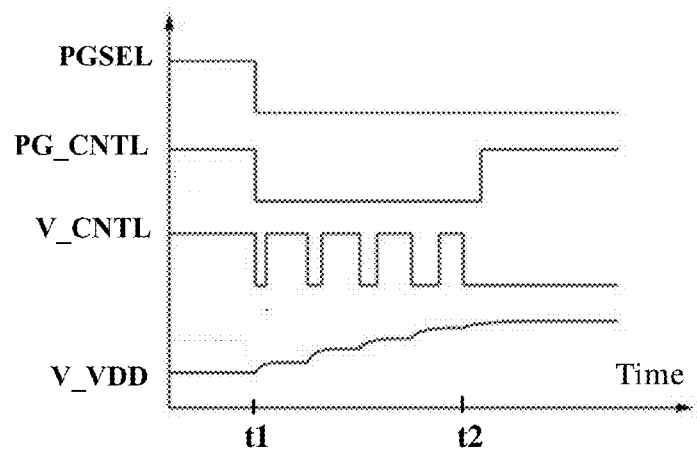
Figure 5C:
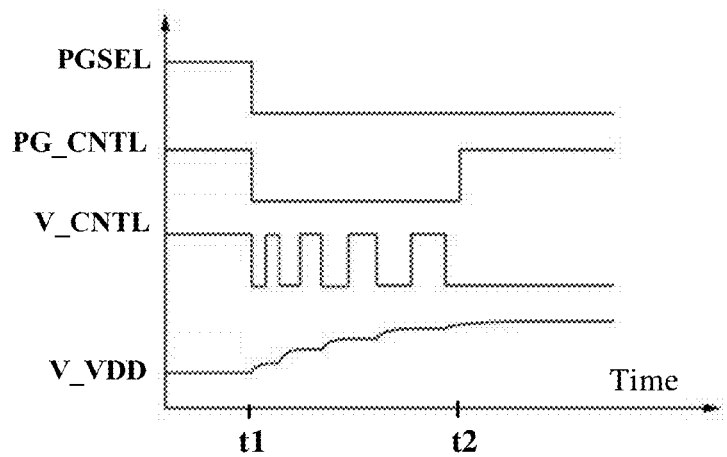

FIGS. 5A to 5C show how to modulate the oscillation signal outputted from the modulation oscillator with V_VDD. It can be seen from FIGS. 5A to 5C that, at time t1, the gating signal PGSEL changes to be valid, i.e., a low level, the enabling signal PG_CNTL of the modulation oscillator also changes to a low level, and thereby the modulation oscillator begins to operate; the charging process of the circuit module is started, and V_VDD gradually increases from the ground level. At time t2, the gating signal PGSEL is still valid, i.e., a low level; V_VDD reaches the power supply level; the enabling signal PG_CNTL of the modulation oscillator turns to a high level, and the modulation oscillator stop operating.

According to another embodiment of this invention, the output of the modulation oscillator controller is further connected to a level clamping circuit as an enabling signal of the level clamping circuit. The level clamping circuit and the modulation oscillator are enabled at different logic levels. In compliance with the above assumption, the level clamping circuit has the output terminal of the oscillation controller connected to the ground in its enabled state. Because the output terminal of the oscillation controller is connected to the control signal input terminal of the switch circuit, the level clamping circuit actually fixes the output signal of the oscillation controller to a level at which the switch circuit is turned on. Thus, after time t2, the output of the modulation oscillator controller makes the modulation oscillator stop operation and enables the level clamping circuit, so that the output terminal of the modulation oscillator is connected to the ground so as to have a fixed logic-low level. Thereby, after t2, the switch circuit is continuously turned on.

Figure 6:
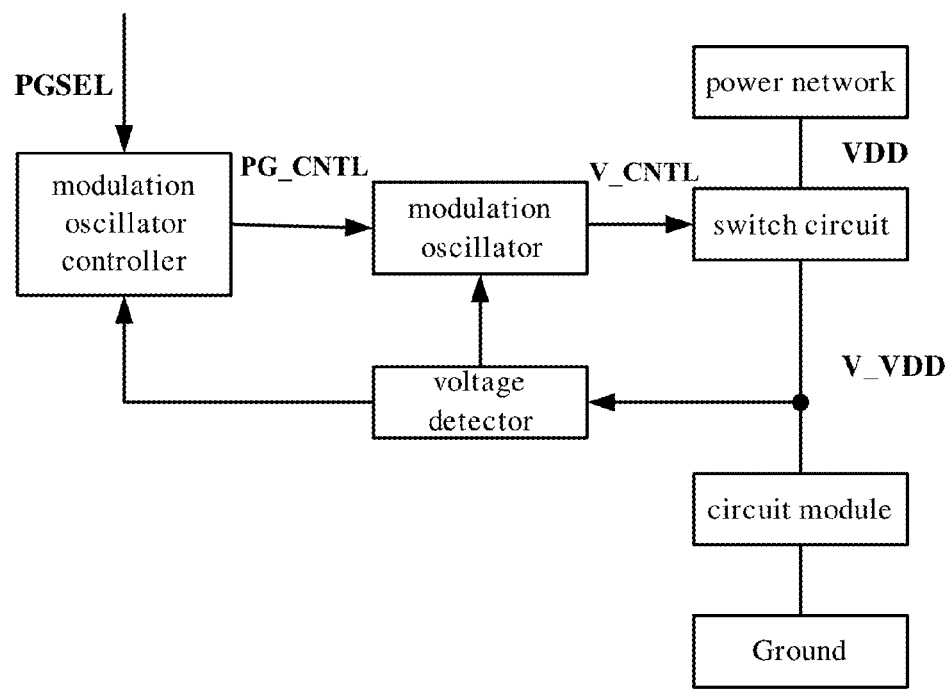

FIG. 6 shows a circuit for power gating according to still another embodiment of this invention. In FIG. 6, instead of directly connecting the first node to the modulation oscillator and the modulation oscillator controller, the first node is connected to the modulation oscillator and the modulation oscillator controller via a level detector. A signal outputted from the level detector to the modulation oscillator and the modulation oscillator controller represents the difference between V_VDD and the power supply level. The modulation oscillator and the modulation oscillator controller are adjusted correspondingly. After the adjustment, the modulation oscillator controller still enables the modulation oscillator when the gating signal is valid and the level of V_VDD reaches the power supply level; and the oscillation signal used as the switch circuit control signal that is outputted from the modulation oscillator still makes the switch circuit satisfy the following: the mount of charges transferred during one turn-on duration of the switch circuit under the control of oscillation signal is a decreasing function of the difference between V_VDD and the power supply level.

As described above, the amplitude, duty ratio and cycle of the oscillation signal are decreasing functions of the difference between V_VDD and the power supply level; the enabling signal of the modulation oscillator causes the modulation oscillator to stop operating when V_VDD reaches the power supply level, i.e., the difference between V_VDD and the power supply level is zero; the enabling signal of the level clamping circuit enables the level clamping circuit when V_VDD reaches the power supply level, i.e., the difference between V_VDD and the power supply level is zero. Thus, although a level detector is added in the structure shown in FIG. 6, other modules such as the modulation oscillator, the modulation oscillator controller, the level clamping circuit, etc., are simplified, so that the overall structure of the circuit for power gating according to embodiments of this invention is simplified.

Figure 7:
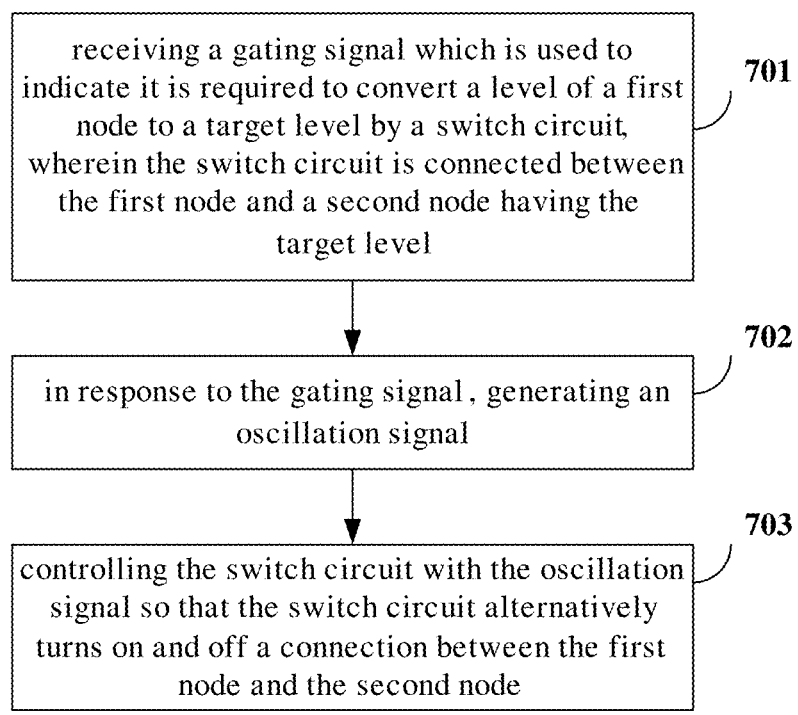
FIG. 7 is a flowchart of a method for power gating according to an embodiment of this invention.

FIG. 7 shows a flowchart of a method for power gating according to an embodiment of this invention. At step 701, a gating signal is received, which is used to indicate it is required to convert a level of a first node to a target level by a switch circuit, and the switch circuit is connected between the first node and a second node having the target level. At step 702, in response to the gating signal, an oscillation signal is generated.

The oscillation signal may be generated by using an oscillator. The gating signal may be used as an enabling signal of the oscillator. At step 703, the switch circuit is controlled with the oscillation signal so that the switch circuit alternatively turns on and off a connection between the first node and the second node, wherein the oscillation signal is modulated by the level of the first node.

As described above, according to an embodiment of this invention, the larger the difference between the level of the first node and the target level is, the smaller the amount of charges through the switch circuit is during one turn-on duration of the switch circuit under the control of the oscillation signal. This modulation may be realized by setting the amplitude of the oscillation signal as a decreasing function of the difference between the level of the first node and the target level, setting the duty ratio of the oscillation signal as a decreasing function of the difference between the level of the first node and the target level, or setting the cycle of the oscillation signal as a decreasing function of the difference between the level of the first node and the target level.

The method further comprises fixing the oscillation signal to a level capable of turning on the switch circuit when the level of the first node reaches the target level.

Figure 8A:
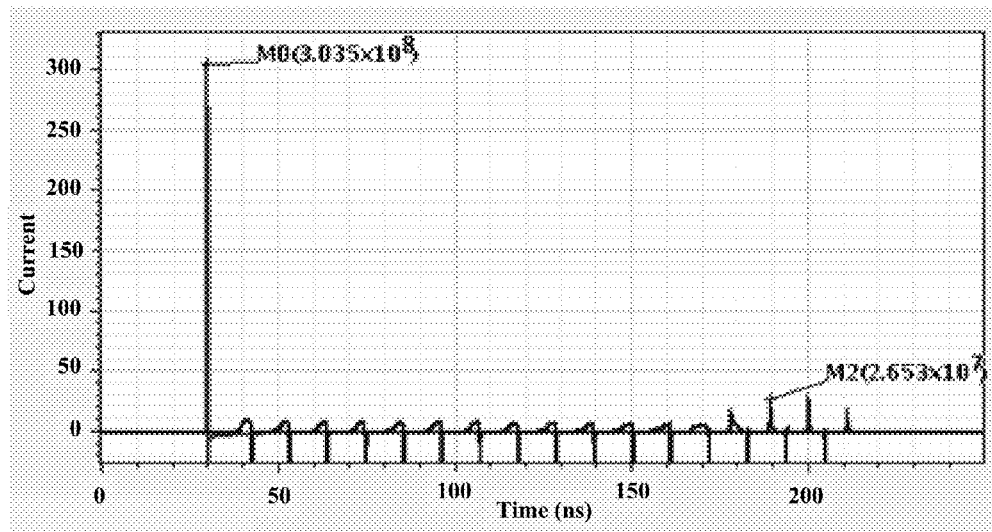
Figure 8A:
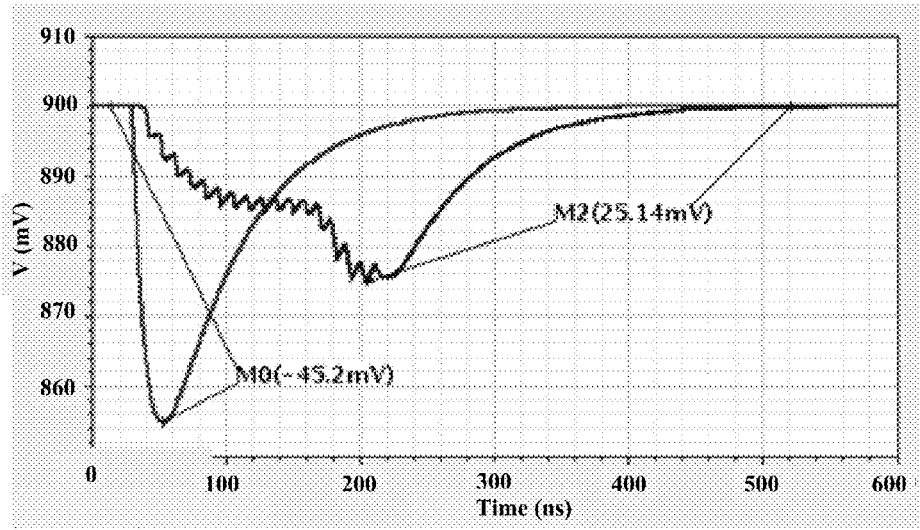

FIG. 8A and FIG. 8B show a performance comparison between the solution according to the embodiment of this invention and the solution in the prior art. The vertical axis of FIG. 8A represents current flowing through the switch circuit when the circuit module is connected to the power supply, and the vertical axis of FIG. 8B represents the power supply level when the circuit module is connected to the power supply. The horizontal axis of each of these two figures represents time. In FIG. 8A, point M0 represents a maximum transient current flowing through the switch circuit in power gating according to the solution in the prior art; M2 represents a maximum transient current flowing through the switch circuit in power gating according to the solution of the embodiment of this invention. The larger the transient maximum current is, the larger influence is produced on the power supply at that timing. In FIG. 8B, M0 represents the power supply level has a jitter of 45.2 mV in power gating according to the solution in the prior art; M2 represents the power supply level has a jitter of 25.14 mV in power gating according to the solution of the embodiment of this invention. It can be seen that, with the solution according to the embodiment of this invention, the influence produced on the power supply when the circuit module is connected to the power supply is reduced, so that the potential noise is reduced.

Although various devices of this invention have been described above in connection with particular embodiments, this invention is not limited thereto. With the teaching of the description, those of ordinary skilled in the art may make many modifications, replacements and alternations to this invention without departing from the scope and spirit of the invention. It may be appreciated that, all these modifications, replacements and alternations are all encompassed in the scope of this invention, which is defined by the appended claims.

What is claimed is:

1. A circuit for power gating, comprising:
a switch circuit connected between a circuit module and a power network having a target level, the switch circuit receives a control signal at a control signal input terminal to gate a connection between the circuit module and the power network under the control of the control signal, wherein the switch circuit is connected to the circuit module at a first node; and
a modulation oscillator, wherein an enabling signal input terminal of the modulation oscillator is connected to a gating signal for enabling the modulation oscillator, a control signal input terminal of the modulation oscillator is connected to the first node, and an output terminal of the modulation oscillator is connected to the control signal input terminal of the switch circuit, wherein an oscillation signal output from the modulation oscillator is modulated by the level of the first node, wherein the greater the difference between the first node level and the target level, the smaller the oscillation signal output transferred during one turn-on duration of the switch circuit, and wherein the amplitude of the oscillation signal is a decreasing function of the difference between the level of the first node and the target level.

2. The circuit according to claim 1, wherein the duty ratio of the oscillation signal is a decreasing function of the difference between the level of the first node and the target level, and wherein the duty ratio is the ratio of a duration during which the switch circuit can be turned on to the duration of one cycle of the oscillation signal.

3. The circuit according to claim 1, wherein the cycle of the oscillation signal is a decreasing function of the difference between the level of the first node and the target level.

4. The circuit according to claims 1, further comprising:
a modulation oscillator controller, wherein a first input terminal of the modulation oscillator controller is connected to the gating signal, a second input terminal of the modulation oscillator controller is connected to the first node, and an output terminal of the modulation oscillator controller is connected to the enabling signal input terminal of the modulation oscillator, wherein the modulation oscillator controller enables the modulation oscillator when the gating signal is valid and the level of the first node reaches the power supply level.

5. The circuit according to claim 4, further comprising a level clamping circuit, wherein an enabling signal input terminal of the level clamping circuit is connected to the output terminal of the modulation oscillator controller, and the logic level at which the level clamping circuit is enabled is different from the logic level at which the modulation oscillator is enabled, and wherein the enabled level clamping circuit clamps the output signal of the oscillator controller to a level at which the switch circuit is turned on.

6. The circuit according to claim 4, further comprising:
a level detector, wherein the first node is connected to the modulation oscillator controller via the level detector, and a signal outputted from the level detector to the modulation oscillator controller represents the difference between the level of the first node and the target level.

7. The circuit according to claim 1, further comprising:
a level detector, wherein an input terminal of the level detector is connected to the first node, an output terminal of the level detector is connected to the control signal input terminal of the modulation oscillator, and a signal outputted from the level detector represents the difference between the level of the first node and the target level.

8. A method for power gating, comprising:
receiving a gating signal with a modulation oscillator, the gating signal indicates whether to convert a level of a first node to a target level by a switch circuit, wherein the switch circuit is connected between the first node and a second node having the target level;
in response to receiving the gating signal, generating an oscillation signal with the modulation oscillator; and
receiving the oscillation signal with the switch circuit, the oscillation signal controls switch circuit to alternatively turn on and off a connection between the first node and the second node, wherein the oscillation signal is modulated by the level of the first node, wherein the greater the difference between the first node level and the target level, the smaller the oscillation signal transferred during to the switch circuit during one turn-on duration of the switch circuit, and wherein an amplitude of the oscillation signal is a decreasing function of the difference between the level of the first node and the target level.

9. The method for power gating according to claim 8, wherein a duty ratio of the oscillation signal is a decreasing function of the difference between the level of the first node and the target level, and wherein the duty ratio is the ratio of a duration during which the switch circuit can be turned on to the duration of one cycle of the oscillation signal.

10. The method for power gating according to claim 8, wherein a cycle of the oscillation signal is a decreasing function of the difference between the level of the first node and the target level.

11. The method for power gating according to claim 8, further comprising:
clamping the oscillation signal to a level at which the switch circuit is turned on when the level of the first node reaches the target level.

* * * * *